United States Patent
Chiu

(10) Patent No.: US 12,272,415 B2
(45) Date of Patent: Apr. 8, 2025

(54) SYSTEM AND METHOD FOR TESTING MEMORY DEVICE

(71) Applicant: NANYA TECHNOLOGY CORPORATION, New Taipei (TW)

(72) Inventor: Yaochang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 125 days.

(21) Appl. No.: 18/209,051

(22) Filed: Jun. 13, 2023

(65) Prior Publication Data

US 2024/0420788 A1  Dec. 19, 2024

(51) Int. Cl.
*G11C 29/12* (2006.01)
*G11C 29/10* (2006.01)

(52) U.S. Cl.
CPC .......... *G11C 29/1201* (2013.01); *G11C 29/10* (2013.01); *G11C 29/12005* (2013.01)

(58) Field of Classification Search
CPC .............................. G11C 29/1201; G11C 29/10
See application file for complete search history.

(56) References Cited

U.S. PATENT DOCUMENTS

2013/0128662 A1* 5/2013 Song .............. G11C 11/56
                                           365/185.03
2014/0063894 A1* 3/2014 Yoon ............... G11C 17/18
                                           365/96

FOREIGN PATENT DOCUMENTS

TW    200907990 A    2/2009

* cited by examiner

*Primary Examiner* — Han Yang
(74) *Attorney, Agent, or Firm* — CKC & Partners Co., LLC

(57) ABSTRACT

The present disclosure provides a system comprising a memory device and a processor. The memory device operates with a supply voltage having a first value. The processor is operatively coupled to the memory device and executes: generating a write command for writing a first datum to the memory device; generating a first read command for reading a second datum from the memory device and comparing the first datum and the second datum; adjusting the supply voltage to have a second value different from the first value; and generating a second read command for reading a third datum from the memory device and comparing the first datum and the third datum for a test result.

20 Claims, 2 Drawing Sheets

SYSTEM AND METHOD FOR TESTING MEMORY DEVICE

BACKGROUND

Field of Invention

The present invention relates to a system and a method for testing memory device. More particularly, the present invention relates to a system and a method for testing memory device operating with different voltages.

Description of Related Art

With the rapidly developed technologies of manufacturing processes of memory device, memory devices designed smaller and having circuits with high density. Increasing density of circuits results in benefits in terms of speed and functionality, but errors and fabrication issues are projected to increase. It is usually necessary to test a memory device to confirm the process stability and the yield.

SUMMARY

In some embodiments, a system is provided. The system comprises a memory device and a processor. The memory device operates with a supply voltage having a first value. The processor is operatively coupled to the memory device and configured to: generate a write command for writing a first datum to the memory device; generate a first read command for reading a second datum from the memory device and comparing the first datum and the second datum; adjust the supply voltage to have a second value different from the first value; and generate a second read command for reading a third datum from the memory device and comparing the first datum and the third datum for a test result.

In some embodiments, the processor is further configured to: adjust the supply voltage to have a third value different from the first value and the second value, wherein the second value is a minimum limit voltage value for operating the memory device and the third value is a maximum limit voltage value for operating the memory device; and generate a third read command for reading a third datum from the memory device and comparing the first datum and the third datum.

In some embodiments, the processor is further configured to: adjust the supply voltage to have a third value, wherein the second value is the first value plus an increase value, and the third value is the second value plus the increase value; and generate a third read command for reading a third datum from the memory device and comparing the first datum and the third datum.

In some embodiments, the processor is further configured to determine whether the memory device meets a rule according to a comparison of the first datum and the second datum and the comparison of the first datum and the third datum.

In some embodiments, the reading the second datum from the memory device comprises performing a read operation to a memory cell that the first datum is written to for getting the second datum.

In some embodiments, a method for testing a memory device is provided. The method comprises: initializing the memory device; writing a first write datum to the memory device with the memory device operated by a first voltage set; performing a first read operation to the memory device to compare the first write datum and a first read datum; after performing the first read operation, directly operating the memory device with a second voltage set different to the first voltage set and performing a second read operation to the memory device to get a second read datum; and comparing the first write datum and the second read datum for a test result.

In some embodiments, the method further comprises: operating the memory device with a third voltage set different to the first and second voltage sets and performing a third read operation to the memory device to get a third read datum, wherein each one of the second voltage set are lower than a corresponding one of the first voltage set, and each one of the third voltage set are higher than a corresponding one of the voltages of the first voltage set; and comparing the first write datum and the third read datum.

In some embodiments, the method further comprises: generating an instruction for a termination of testing the memory device according to the comparing the first write datum and the first read datum and the comparing the first write datum and the second read datum.

In some embodiments, the first and second read operations correspond to a same memory address.

In some embodiments, each voltage of the second voltage set are higher than a corresponding voltage of the first voltage set and the method further comprises: operating the memory device with a third voltage set and performing a third read operation to the memory device to get a third read datum, in which each voltage of the third voltage set are higher than a corresponding voltage of the second voltage set, and comparing the first write datum and the third read datum.

In some embodiments, the method further comprising: recording values of the first voltage set when the first write datum is unequal to the first read data in the test result; and recording values of the second voltage set when the first write datum is unequal to the second read datum in the test result.

In some embodiments, a method for testing a memory device is provided. The method comprises: (a) generating a first list of voltage values; (b) initializing the memory device and setting a supply voltage of the memory device according to the first list; (c) performing a first write operation of a first write datum to the memory device; (d) reading the memory device; (e) changing a value of the supply voltage according to the first list and reading the memory device; and (f) repeating the operation (e) according to the first list.

In some embodiments, the operation (d) comprises recording a read datum to a second list and the operation (e) comprises appending a new read datum to the second list.

In some embodiments, the operation (f) comprises terminating the repeating when the new read datum is not equal to the first write datum.

In some embodiments, the method further comprises: comparing each one of data of the second list and the first write datum and when a datum of the second list is not equal to the first write datum appending a corresponding value of the supply voltage to a third list; and determining whether the memory device is defective according to the third list.

In some embodiments, the first list is an arithmetic sequence of the voltage values.

In some embodiments, the operation (e) further comprises: after a reading operation, directly changing a value of the supply voltage according to the first list and reading the memory device.

In some embodiments, the first write operation corresponds to a first memory address, and the method further comprises: changing the value of the supply voltage and performing a second write operation of the first write datum corresponding to a second memory address of the memory device.

In some embodiments, an order of the voltage values in the first list is according to failure probabilities of the memory device operated by the voltage values.

In some embodiments, the method further comprises: after the operation (f), directly operating the memory device with a third voltage set different to the first and second voltage sets and writing a second write datum to the memory device, performing a third read operation to the memory device to get a third read datum; and comparing the second write datum and the third read datum for a test result.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
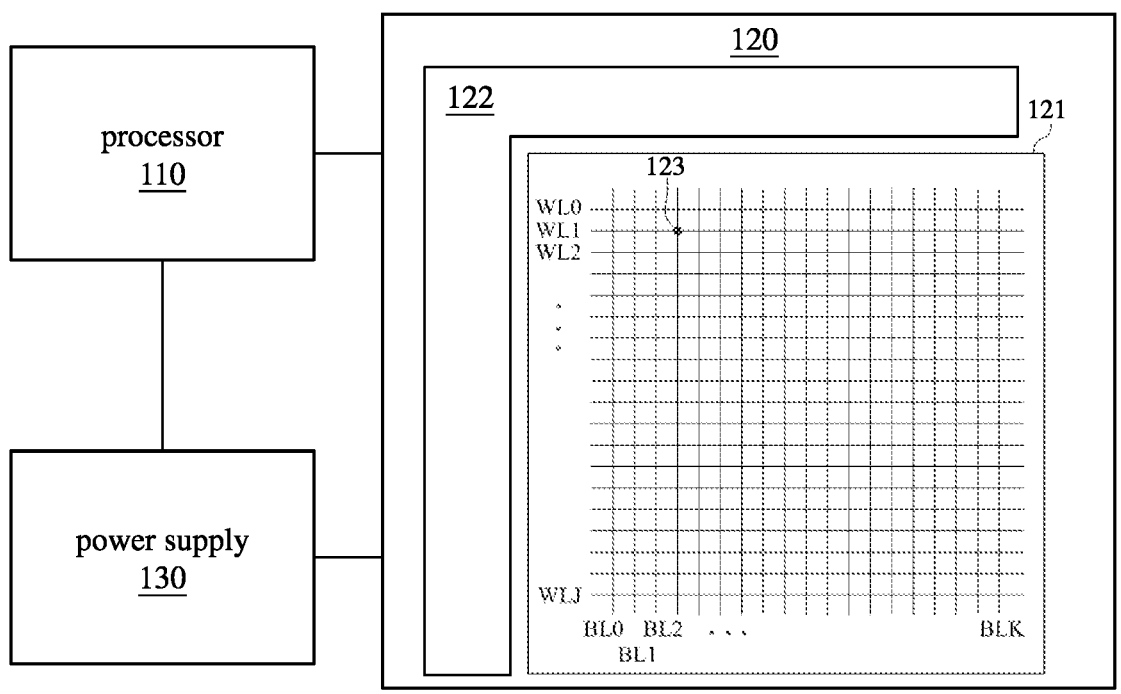
FIG. 1 is a schematic diagram of a system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a schematic diagram of a system 100 in accordance with various embodiments of the present disclosure. For illustration, the system 100 includes a processor 110, a memory device 120 and a power supply 130. As shown in FIG. 1, according to some embodiments, the processor 110 is operatively coupled to the memory device 120 and the power supply 130, and the memory device 120 is operatively coupled to the power supply 130. In some embodiments, the system 100 is configured to test the memory device 120. For example, the system 100 is configured to test the effects of an operating voltage change to the memory device 120 or valid operating voltages of the memory device 120 (supply voltages with which memory device 120 functions correctly) and further details will be described in paragraphs below.

In some embodiments, the processor 110 includes a central processing unit (CPU), or other programmable general-purpose or special-purpose micro control units (MCU), microprocessors, digital signal processors (DSP), programmable controllers, application-specific integrated circuits (ASIC), graphics processing units (GPU), arithmetic logic units (ALU), complex programmable logic devices (CPLD), field-programmable gate arrays (FPGA), or other similar components or a combination of the above components.

In some embodiments, the memory device 120 is a hardware component that stores data. As shown in FIG. 1, according to some embodiments, the memory device 120 includes a memory array 121 and a memory controller 122. The memory array 121 includes multiple memory cells 123 (storage circuits) arranged in a two or three dimensional array. According to various embodiments, memory cells 123 include volatile memory cells, non-volatile memory cells, or a combination of them. In some embodiments, each memory cell 123 is embodied as a dynamic random-access memory (DRAM) cell.

In practice, the memory array 121 further includes word lines WL0, WL1 .... WLJ and bit lines BL0, BL1 .... BLK. In some embodiments, the word lines WL0-WLJ and the bit lines BL0-BLK include conductive metals or conductive rails. For illustration, each one of the memory cells 123 is coupled to a corresponding word line WL (one of the word lines WL0-WLJ) and a corresponding bit line BL (one of the bit lines BL0-BLK). In some embodiments, the memory array 121 includes additional lines (e.g., select lines, reference lines, reference control lines, power rails, etc.).

According to some embodiments of the present disclosure, the memory controller 122 is a hardware component that executes operations to the memory array 121 according to commands from the processor 110. For example, in some embodiments, the memory controller executes a write operation or a read operation to the memory array 121 according to a command from the processor 110. In some embodiments, the memory controller 122 is configured to write data to or read data from the memory array 121 through the word lines WL and the bit lines BL.

In some embodiments, the power supply 130 is a programmable power supply or a controllable power supply. In some embodiments, the power supply 130 provides a regulated DC output. In some embodiments, the power supply 130 provides multiple outputs with various voltages. In some embodiments, the voltages of the outputs of the power supply 130 are controlled by the processor 110.

As described above, the system 100 is configured to test the memory device 120, for example, testing the valid operating voltages of the memory device 120. According to some embodiments of the present disclosure, to test the memory device 120, the processor 110 firstly controls the power supply 130 to provide outputs with initial supply voltages for operating the memory device 120. For example, in some embodiments, the memory device 120 is a Low-Power Double Data Rate Fourth Generation Synchronous Dynamic Random Access Memory LPDDR4 SDRAM or a LPDDR4x SDRAM and the processor 110 controls the initial supply voltages of the outputs of the power supply 130 to be about 1.8V, 1.1V and 0.6V, in which the voltage values 1.8V, 1.1V and 0.6V are the nominal voltage values of the three supply voltages VDD1, VDD2 and VDDQ. In some embodiments, the supply voltages are defined in a JEDEC standard like JESD209-4-1 or JESD209-4c.

Then the processor 110 generates and transmits an initialization command to the memory device 120. In response to the initialization command, the memory device 120 executes an initialization operation. For example, in some embodiments, the memory device 120 is powered up during the initialization operation. In some embodiments, the initialization operation includes read/write training and/or signals calibration like the reference voltage (Vref) calibration of the data query (DQ) bus. In various embodiments, the DRAM initialization operation that includes a well-defined sequence of steps recited in the JEDEC standards like JESD209-4-1 and JESD209-4c.

After the initialization command, the processor 110 generates and transmits a write command to the memory device 120 to perform the write operation to the memory device 120. In some embodiments, the write command includes a datum to be written to the memory device 120 and an address corresponding to one or more memory cells 123 to store the datum. In response to the write command, the memory controller 122 executes a write operation to write the datum to the memory cell 123 according to the address with the memory device operated by the initial supply voltages.

Then the processor 110 generates and transmits a read command to the memory device 120 to perform the read operation to the memory device 120. In some embodiments, the read command includes the memory address corresponding to the write command (i.e., the memory address of the memory cell 123 storing the written datum). In response to the read command, the memory controller 122 executes a read operation corresponding to the memory address. In some embodiments, the memory controller 122 executes the read operation to get a read datum with the memory device 120 operated by the initial supply voltages.

In some embodiments, the memory device 120 transmits the read datum to the processor 110 and the processor 110 makes a comparison of the read datum and the write datum (the datum written to the memory device 120 described above). In some embodiments, through the comparison, the processor 110 makes a determination of whether the initial supply voltages are valid operating voltages of the memory device 120 (i.e., whether the memory device 120 functions correctly while the memory device 120 is operated by the initial supply voltages). For example, when the read datum and the write datum are determined equal to each other through the comparison, the processor 110 determines that the initial supply voltages are valid operating voltages of the memory device 120. On the contrary, when the read datum and the write datum are determined unequal to each other through the comparison, the processor 110 determines that the initial supply voltages are invalid operating voltages of the memory device 120.

After the read operation described above (the read operation executed with the memory device 120 operated by the initial supply voltages), the processor 110 controls the power supply 130 to provide outputs with updated supply voltages, different from the initial supply voltages, for operating the memory device 120. For example, the updated supply voltages are smaller than the initial supply voltages. In some embodiments, the processor 110 adjusts the outputs of the power supply 130 from about 1.8V, 1.1V and 0.6V to about 1.7V, 1.06V and 0.57V respectively. In some embodiments, the voltage values 1.7V, 1.06V and 0.57V are the minimum voltage values of the three supply voltages VDD1, VDD2 and VDDQ.

Then the processor 110 generates and transmits a read command to the memory device 120 with the memory device 120 operated by the updated supply voltages (e.g., the supply voltages with voltage values about 1.7V, 1.06V and 0.57V described above). In some embodiments, the read command corresponding to the updated supply voltages includes a memory address that is equal to the memory address included in the read command corresponding to the initial supply voltages. In response to the read command corresponding to the updated supply voltages, the memory controller 122 executes a read operation to get a read datum with the memory device 120 operated by the updated supply voltages. In some embodiments, there is no initialization operation between the read operation corresponding to the initial supply voltages and the read operation corresponding to the updated supply voltages. In some embodiments, the memory device 120 performs the read operation corresponding to the updated supply voltages directly after the read operation corresponding to the initial supply voltages.

In some embodiments, there is no initialization operation after the read operation corresponding to the initial supply voltages and after the processor 110 controls the power supply 130 to output the updated supply voltages instead of the initial supply voltages, the supply voltages to the memory device 120 corresponding to each read operation that corresponds to the memory address of the write operation of the write datum will not be the initial supply voltages.

In some embodiments, the memory device 120 transmits the read datum corresponding to the updated supply voltages to the processor 110 and the processor 110 makes a comparison of the read datum corresponding to the updated supply voltages and the write datum (the datum written to the memory device 120 described above). In some embodiments, through the comparison, the processor 110 makes a determination of whether the updated supply voltages are valid operating voltages of the memory device 120 (i.e., whether the memory device 120 functions correctly while the memory device 120 is operated by the updated supply voltages). For example, when the read datum corresponding to the updated supply voltages and the write datum are determined equal to each other through the comparison, the processor 110 determines that the updated supply voltages are valid operating voltages of the memory device 120. On the contrary, when the read datum corresponding to the updated supply voltages and the write datum are determined unequal to each other through the comparison, the processor 110 determines that the updated supply voltages are invalid operating voltages of the memory device 120.

According to some embodiments of the present disclosure, after the read operation corresponding to the updated supply voltages, the processor 110 controls the power supply 130 to provide outputs with further updated supply voltages, different from the updated supply voltages, for operating the memory device 120. For example, the further updated supply voltages are higher than the initial supply voltages. In some embodiments, the processor 110 adjusts the outputs of the power supply 130 from about 1.7V, 1.06V and 0.57V to about 1.95V, 1.17V and 0.65V respectively. In some embodiments, the voltage values 1.95V, 1.17V and 0.65V are the maximum voltage values of the three supply voltages VDD1, VDD2 and VDDQ.

Then the processor 110 generates and transmits a read command to the memory device 120 with the memory device 120 operated by the further updated supply voltages (e.g., the supply voltages with voltage values about 1.95V, 1.17V and 0.65V described above). In some embodiments, the read command corresponding to the further updated supply voltages includes a memory address that is equal to the memory address included in the read command corresponding to the updated supply voltages (e.g., the supply voltages with voltage values about 1.7V, 1.06V and 0.57V described above). In response to the read command corresponding to the further updated supply voltages, the memory controller 122 executes a read operation to get a read datum with the memory device 120 operated by the further updated supply voltages. In some embodiments, there is no initialization operation between the read operation corresponding to the updated supply voltages and the read operation corresponding to the further updated supply voltages. In some embodiments, the memory device 120 performs the read operation corresponding to the further updated supply voltages directly after the read operation corresponding to the updated supply voltages.

In some embodiments, the memory device 120 transmits the read datum corresponding to the further updated supply voltages to the processor 110 and the processor 110 makes a comparison of the read datum corresponding to the further updated supply voltages and the write datum (the datum written to the memory device 120 described above). In some embodiments, through the comparison, the processor 110 makes a determination of whether the further updated supply voltages are valid operating voltages of the memory device 120 (i.e., whether the memory device 120 functions correctly while the memory device 120 is operated by the further updated supply voltages). For example, when the read datum corresponding to the further updated supply voltages and the write datum are determined equal to each other through the comparison, the processor 110 determines that the further updated supply voltages are valid operating voltages of the memory device 120. On the contrary, when the read datum corresponding to the further updated supply voltages and the write datum are determined unequal to each other through the comparison, the processor 110 determines that the further updated supply voltages are invalid operating voltages of the memory device 120.

In some embodiments, the set of the initial supply voltages is the normal operating voltage set of the memory device 120. For example, the normal operating voltage set may be the set of voltages that operate the memory device 120 the most stably and/or the most efficiently. For example, in some embodiments the set of the initial supply voltages is approximately the nominal voltage set of the voltage values 1.8V, 1.1V and 0.6V when the memory device 120 is a low operational voltage memory device, for example, LPDDR4 memory device. In some embodiments, the updated supply voltages are set to be lower than the initial supply voltages and the further updated supply voltages are set to be higher than the initial supply voltages. For example, the set of the updated supply voltages may be approximately the minimum supply voltage set recited in a specification of the memory device 120 like the voltage set of the voltages 1.7V, 1.06V and 0.57V and the further updated supply voltages may be approximately the maximum supply voltage set recited in the specification of the memory device 120 like the voltage set of the voltage values 1.95V, 1.17V and 0.65V.

In various embodiments, instead of adjusting all outputs of the power supply 130 at one time, the processor 110 may only adjust one or some of the outputs of the power supply 130 at one time. For example, in some embodiments, the processor 110 adjusts only the supply voltage VDD1 of the supply voltages VDD1, VDD2 and VDDQ between two read operations or between a write operation and a read operation. In some embodiments, the supply voltages VDD1, VDD2 and VDDQ change from the initial supply voltages with voltage values 1.8V, 1.1V and 0.6V to the updated supply voltages with voltage values 1.7V, 1.1V and 0.6V. In various embodiments, the updated supply voltages are higher than the initial supply voltages and the further updated supply voltages are higher than the updated supply voltages. For example, in some embodiments, the supply voltages VDD1, VDD2 and VDDQ increase from the initial supply voltages with voltage values 1.7V, 1.06V and 0.57V to the updated supply voltages with voltage values 1.8V, 1.1V and 0.6V, and further increase to the further updated supply voltages with voltage values 1.95V, 1.17V and 0.65V.

In some embodiments, the processor 110 repeats adjusting the outputs of the power supply 130 and transmitting a read command to the memory device 120 for multiple times (may be more than three times) after a write operation. In some embodiments, the adjusting the outputs of the power supply 130 is increasing the voltage value of one of the outputs with a increase values, for example, about 0.01V.

In some embodiments, the processor 110 is further configured to generate a list of voltage values. In some embodiments, the processor 110 repeats adjusting the outputs of the power supply 130 according to the list of voltage values. For example, in some embodiments, the processor 110 firstly controls the power supply 130 to output a supply voltage with a first voltage in the list of voltage values, then the processor 110 controls the power supply 130 to adjust the supply voltage to have a second voltage in the list of voltage values directly after a first read operation, then the processor 110 controls the power supply 130 to adjust the supply voltage to have a third voltage in the list of voltage values directly after a second read operation, and so on.

In some embodiments, the list of voltage values includes an arithmetic sequence of voltage values. For example, according to some embodiments, the list of voltage values includes an arithmetic sequence with a common difference of 0.025 (V). In various embodiments, the order of the voltage values of the list of voltage values is according to failure probabilities of the memory device 120 operated by the voltage values. For example, the first voltage value (i.e., the initial voltages) in the list of voltage values is the value of the supply voltage operating the memory device 120 the most stably which may be recited in a specification of the memory device 120, the second voltage value in the list of voltage values is higher than the first voltage value and the memory device 120 has a higher failure probability while being operated by a supply voltage with the second voltage value than being operated by the supply voltage with the first voltage value.

In practice, the processor 110 stops repeating adjusting the outputs of the power supply 130 and stops transmitting a read command to the memory device 120 according to a comparison result of a datum read from the memory device 120 and the write datum according to some embodiments of the present disclosure. For example, when a comparison result indicates that the datum read from the memory device 120 and the write datum are unequal to each other, the processor 110 stops repeating adjusting the outputs of the power supply 130 and stops transmitting a read command to the memory device 120.

In some embodiments, after the repetition of adjusting the outputs of the power supply 130 and transmitting a read command to the memory device 120, the processor 110 generates a write command for the memory controller 122 to execute a write operation different from the write operation executed right after the initialization operation as described above. In some embodiments, after the repetition of adjusting the outputs of the power supply 130 and transmitting a read command to the memory device 120, the processor 110 directly controls the power supply 130 to change outputs of the power supply 130 operating the memory device 120 and generates a write command for the memory controller 122 to execute a write operation different from the write operation executed right after the initialization operation as described above.

In some embodiments, the memory address corresponding to the write operation right after the initialization operation is different from the memory address corresponding to the write operation after the repetition of adjusting the outputs of the power supply 130 and transmitting a read command to the memory device 120. In some embodiments, the write datum of the write operation right after the initialization operation is different from the write datum of the write operation after the repetition of adjusting the outputs of the power supply 130 and transmitting a read command to the memory device 120.

In some embodiments, the processor 110 generates a read command for the memory controller 122 to execute a read operation corresponding to the memory address of the write operation after the repetition of adjusting the outputs of the power supply 130 and transmitting a read command to the memory device 120, and the processor 110 compares the read datum of this read operation and the write datum of the write operation after the repetition of adjusting the outputs of the power supply 130 and transmitting a read command to the memory device 120 for testing the memory device 120.

In some embodiments, the processor 110 further repeats adjusting the outputs of the power supply 130 and transmitting a read command to the memory device 120 after the write operation executed the previous repetition of adjusting the outputs of the power supply 130 and transmitting a read command to the memory device 120 for testing the memory device 120.

According to various embodiments of the present disclosure, the processor 110 is further configured to determine whether the memory device 120 meets a rule according to each comparison of a read datum and a write datum. For example, in some embodiments, the processor 110 determines whether each read datum is equal to a corresponding write datum. In some embodiments, when each read datum is determined equal to a corresponding write datum, the processor 110 determines the memory device 120 as a valid memory device (i.e., a memory device functioning correctly or normally).

In some embodiments, the processor 110 records the read datum of each read operation in a list as a test result. In some embodiments, the processor 110 compares each read datum in the list of read data with a corresponding write datum to determine whether the memory device 120 meets a rule as described in the previous paragraph. In some embodiments, the processor 110 compares each one of the list of read data and the write datum and when a datum of the list of read data is determined unequal to the write data the processor 110 appends the corresponding value of the supply voltage to an invalid supply voltage list. In some embodiments, the processor 110 determines whether the memory device 120 is defective according to the invalid supply voltage list. For example, in some embodiments, the processor 110 determines the memory device 120 as defective when the invalid supply voltage list includes at list one value.

In various embodiments, the processor 110 records the result of each comparison (e.g., Boolean datum indicating whether the datum read from the memory device 120 and the write datum are equal to each other) in a list as a test result. In some embodiments, the processor 110 determines whether the memory device 120 meets a rule as described in the previous paragraph.

The configurations of FIG. 1 are given for illustrative purposes. Various implements are within the contemplated scope of the present disclosure. For example, in some embodiments, the system 100 further includes a storage device like a solid state drive or a hard disk drive. In some embodiments, the storage device is configured to store the read datum of each read operation or each comparison result or the lists described above.

Figure 2:
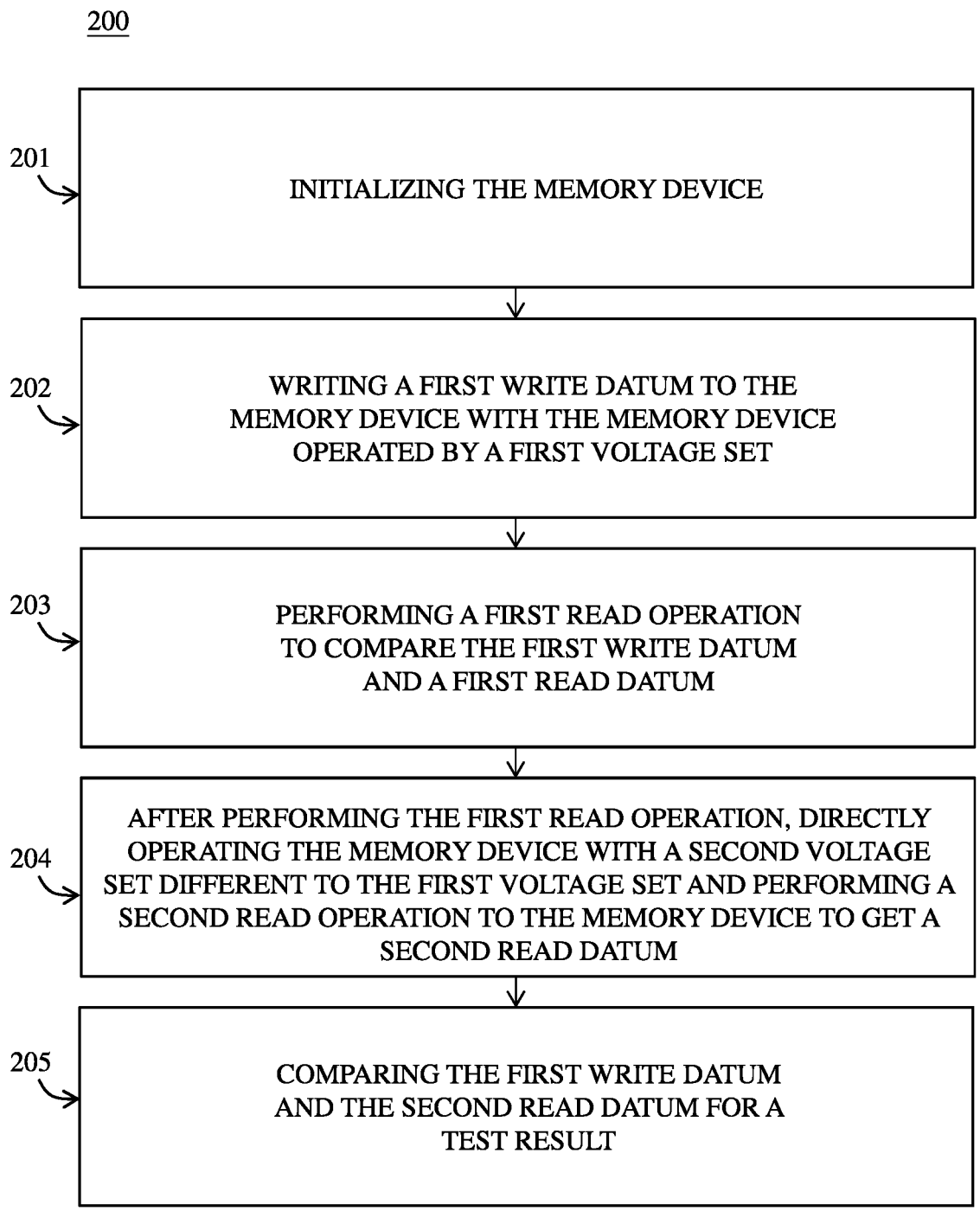
FIG. 2 is an example flowchart of a method according to the system in FIG. 1, in accordance with some embodiments of the present disclosure.

Reference is now made to FIG. 2. FIG. 2 is an example flow chart of a method 200 corresponding to the system 100 in accordance with various embodiments of the present disclosure. It is understood that additional operations/processes can be provided before, during, and after the operations/processes shown by FIG. 2, and some of the operations/processes described below can be replaced or eliminated, for additional embodiments of the method 200. The order of the operations/processes may be interchangeable. Throughout the various views and illustrative embodiments, like reference numbers are used to designate like elements. The method 200 includes operations 201-205 that are described below with reference to FIG. 1.

In operation 201, the memory device 120 is initialized. For example, the processor 110 generates a initialization command for initializing the memory device 120.

In operation 202, a write datum is written to the memory device 120 with the memory device 120 operated by a first voltage set, for example, the voltage set of the voltage values 1.8V, 1.1V and 0.6V.

In operation 203, a first read operation is performed to compare the write datum and a first read datum. For example, in some embodiments, the processor 110 determines whether the write datum is equal to the first read datum got through the first read operation to the memory device 120.

In operation 204, after the first read operation is performed, the memory device 120 is directly operated with a second voltage set (e.g., the voltage set of the voltage values 1.7V, 1.06V and 0.57V) different to the first voltage set and a second read operation to the memory device 120 is performed to get a second read datum.

In operation 205, the write datum and the second read datum is compared for a test result. For example, according to some embodiments, the processor 110 determines whether the write datum is equal to the second read datum got through the second read operation to the memory device 120. When the write datum and the second read datum are determined to be equal to each other, the processor 110 generates a test result indicating that the second voltage set is a valid operating voltage set to the memory device 120. On the contrary, when the write datum and the second read datum are determined to be unequal to each other, the processor 110 generates a test result indicating that the second voltage set is an invalid operating voltage set to the memory device 120.

In some embodiments, the method 200 further comprises operating the memory device 120 with a third voltage set different to the first and second voltage sets and performing a third read operation to the memory device 120 to get a third read datum, in which each one of the second voltage set are lower than a corresponding one of the first voltage set, and each one of the third voltage set are higher than a corresponding one of the voltages of the first voltage set. For example, the voltages of the first voltage set are 1.8V, 1.1V and 0.6V, the voltages of the second voltage set are 1.7V, 1.06V and 0.57V, and the voltages of the third voltage set are 1.95V, 1.17V and 0.65V. In some embodiments, the method 200 further comprises comparing the write datum and the third read datum.

In some embodiments, the method 200 further comprises generating an instruction for a termination of testing the memory device 120 according to the comparing the write datum and the first read datum and the comparing the write datum and the second read datum. For example, in some embodiments, the processor 110 generates an instruction for a terminating a test (e.g., a test of determining whether the voltages operating the memory device 120 are valid supply voltages) to the memory device 120 either when the write datum and the first read datum are determined unequal or when the write datum and the second read datum are determined unequal.

In some embodiments, the first read operation and the second read operation correspond to a same memory address. In other word, the first and second read operation are executed to the same memory cell or cells 123.

In some embodiments, each voltage of the second voltage set is higher than a corresponding voltage of the first voltage set and the method 200 further comprises operating the memory device 120 with a third voltage set and performing a third read operation to the memory device 120 to get a third read datum, in which each voltage of the third voltage set is higher than a corresponding voltage of the second voltage set. For example, the voltages of the first voltage set are 1.7V, 1.06V and 0.57V, the voltages of the second voltage set are 1.8V, 1.1V and 0.6V, and the voltages of the third voltage set are 1.95V, 1.17V and 0.65V. In some embodiments, the method 200 further comprises comparing the write datum and the third read datum.

In some embodiments, the method 200 further comprises recording values of the first voltage set when the write data is unequal to the first read data in the test result and recording values of the second voltage set when the write data is unequal to the second read data in the test result. For example, in some embodiments, the test result is a list and when the write data is unequal to the first read data, the processor records the values of the first voltage set in the list, and when the write data is unequal to the second read data, the processor records the values of the second voltage set in the list.

As described above, the system and the method provided in the present disclosure help quickly verify the impact of a voltage change of a memory device. With the processes of directly adjusting supply voltages between read and/or write operations, the verification time is effectively shorten. Moreover, with some repetitive manual operations being avoided, the manpower is economized. As a result, the analysts are allowed to spend more time on more important things for product development.

While the disclosure has been described by way of example(s) and in terms of the preferred embodiment(s), it is to be understood that the disclosure is not limited thereto. Those skilled in the art may make various changes, substitutions, and alterations herein without departing from the spirit and scope of the present disclosure. In view of the foregoing, it is intended that the present invention cover modifications and variations of this invention provided they fall within the scope of the following claims.

What is claimed is:

1. A system, comprising:
 a memory device configured to operate with a supply voltage having a first value; and
 a processor operatively coupled to the memory device and configured to:
  generate a write command for writing a first datum to the memory device;
  generate a first read command for reading a second datum from the memory device and comparing the first datum and the second datum;
  adjust the supply voltage to have a second value different from the first value; and
  generate a second read command for reading a third datum from the memory device and comparing the first datum and the third datum for a test result.

2. The system of claim 1, wherein the processor is further configured to:
 adjust the supply voltage to have a third value different from the first value and the second value,
 wherein the second value is a minimum limit voltage value for operating the memory device and the third value is a maximum limit voltage value for operating the memory device; and generate a third read command for reading a third datum from the memory device and comparing the first datum and the third datum.

3. The system of claim 1, wherein the processor is further configured to:
adjust the supply voltage to have a third value,
wherein the second value is the first value plus an increase value, and the third value is the second value plus the increase value; and
generate a third read command for reading a third datum from the memory device and comparing the first datum and the third datum.

4. The memory device of claim 1, wherein the processor is further configured to determine whether the memory device meets a rule according to a comparison of the first datum and the second datum and the comparison of the first datum and the third datum.

5. The memory device of claim 1, wherein the reading the second datum from the memory device comprises performing a read operation to a memory cell that the first datum is written to for getting the second datum.

6. A method for testing a memory device, comprising:
initializing the memory device;
writing a write datum to the memory device with the memory device operated by a first voltage set;
performing a first read operation to the memory device to compare the write datum and a first read datum;
after performing the first read operation, directly operating the memory device with a second voltage set different to the first voltage set and performing a second read operation to the memory device to get a second read datum; and
comparing the write datum and the second read datum for a test result.

7. The method of claim 6, further comprising:
operating the memory device with a third voltage set different to the first and second voltage sets and performing a third read operation to the memory device to get a third read datum,
wherein each one of the second voltage set are lower than a corresponding one of the first voltage set, and each one of the third voltage set are higher than a corresponding one of the first voltage set; and
comparing the write datum and the third read datum.

8. The method of claim 6, further comprising:
generating an instruction for a termination of testing the memory device according to the comparing the write datum and the first read datum and the comparing the write datum and the second read datum.

9. The method of claim 6, wherein the first and second read operations correspond to a same memory address.

10. The method of claim 6, wherein each voltage of the second voltage set is higher than a corresponding voltage of the first voltage set and the method further comprises:
operating the memory device with a third voltage set and performing a third read operation to the memory device to get a third read datum,
wherein each voltage of the third voltage set is higher than a corresponding voltage of the second voltage set, and comparing the write datum and the third read datum.

11. The method of claim 6, further comprising:
recording values of the first voltage set when the write datum is unequal to the first read datum in the test result; and
recording values of the second voltage set when the write datum is unequal to the second read datum in the test result.

12. A method for testing a memory device, comprising:
(a) generating a first list of voltage values;
(b) initializing the memory device and setting a supply voltage of the memory device according to the first list;
(c) performing a first write operation of a first write datum to the memory device;
(d) reading the memory device;
(e) changing a value of the supply voltage according to the first list and reading the memory device; and
(f) repeating the operation (e) according to the first list.

13. The method of claim 12, wherein the operation (d) comprises recording a read datum to a second list and the operation (e) comprises appending a new read datum to the second list.

14. The method of claim 13, wherein the operation (f) comprises terminating the repeating when the new read datum is not equal to the first write datum.

15. The method of claim 13, further comprising:
comparing each one of data of the second list and the first write datum and when a datum of the second list is unequal to the first write datum appending a corresponding value of the supply voltage to a third list; and
determining whether the memory device is defective according to the third list.

16. The method of claim 12, wherein the first list is an arithmetic sequence of the voltage values.

17. The method of claim 12, wherein the operation (e) further comprising:
after a reading operation, directly changing a value of the supply voltage according to the first list and reading the memory device.

18. The method of claim 12, wherein the first write operation corresponds to a first memory address, and the method further comprises:
changing the value of the supply voltage and performing a second write operation of the first write datum corresponding to a second memory address of the memory device.

19. The method of claim 12, wherein an order of the voltage values in the first list is according to failure probabilities of the memory device operated by the voltage values.

20. The method of claim 12, further comprising:
after the operation (f), directly operating the memory device with a third voltage set different to the first and second voltage sets and writing a second write datum to the memory device,
performing a third read operation to the memory device to get a third read datum; and
comparing the second write datum and the third read datum for a test result.

* * * * *